United States Patent
Gladish et al.

(10) Patent No.: US 8,884,597 B2
(45) Date of Patent: Nov. 11, 2014

(54) SYNCHRONOUS BUCK CONVERTER WITH DYNAMICALLY ADJUSTABLE LOW SIDE GATE DRIVER

(75) Inventors: Jon Gladish, Jenkins Township, PA (US); Thomas N. Mathes, Cary, NC (US); Sean T. Tarlton, Pittsboro, NC (US)

(73) Assignee: Fairchild Semiconductor Corporation, San Jose, CA (US)

( * ) Notice: Subject to any disclaimer, the term of this patent is extended or adjusted under 35 U.S.C. 154(b) by 217 days.

(21) Appl. No.: 13/554,881

(22) Filed: Jul. 20, 2012

(65) Prior Publication Data

US 2014/0021933 A1 Jan. 23, 2014

(51) Int. Cl.
 *G05F 1/00* (2006.01)
(52) U.S. Cl.
 USPC ............................................. 323/282; 323/285
(58) Field of Classification Search
 USPC .................................. 323/222, 271, 282–285
 See application file for complete search history.

(56) References Cited

U.S. PATENT DOCUMENTS

| 7,928,713 B2 * | 4/2011 | Nguyen ......................... 323/282 |
| 7,932,703 B2 * | 4/2011 | Brohlin et al. ................ 323/222 |
| 2009/0219002 A1 * | 9/2009 | Shirai et al. .................... 323/282 |

* cited by examiner

*Primary Examiner* — Nguyen Tran
(74) *Attorney, Agent, or Firm* — Grossman Tucker Perreault & Pfleger PLLC

(57) ABSTRACT

One embodiment provides A DC-DC converter system that includes a high side switch and a low side switch coupled to a power supply, each switch is configured to transition from an on state to an off state and from an off state to an on state to deliver current to an inductor and a load. This embodiment also includes low side driver circuitry configured to control the conduction state of the low side switch and configured to drive the low side switch with a first gate driving signal during a first mode of operation and with a second gate driving signal during a second mode of operation. The first gate driving voltage is stronger than the second gate driving signal and the second gate driving signal is configured to cause a slower switch transition of the low side switch compared to the first gate drive control signal.

17 Claims, 8 Drawing Sheets

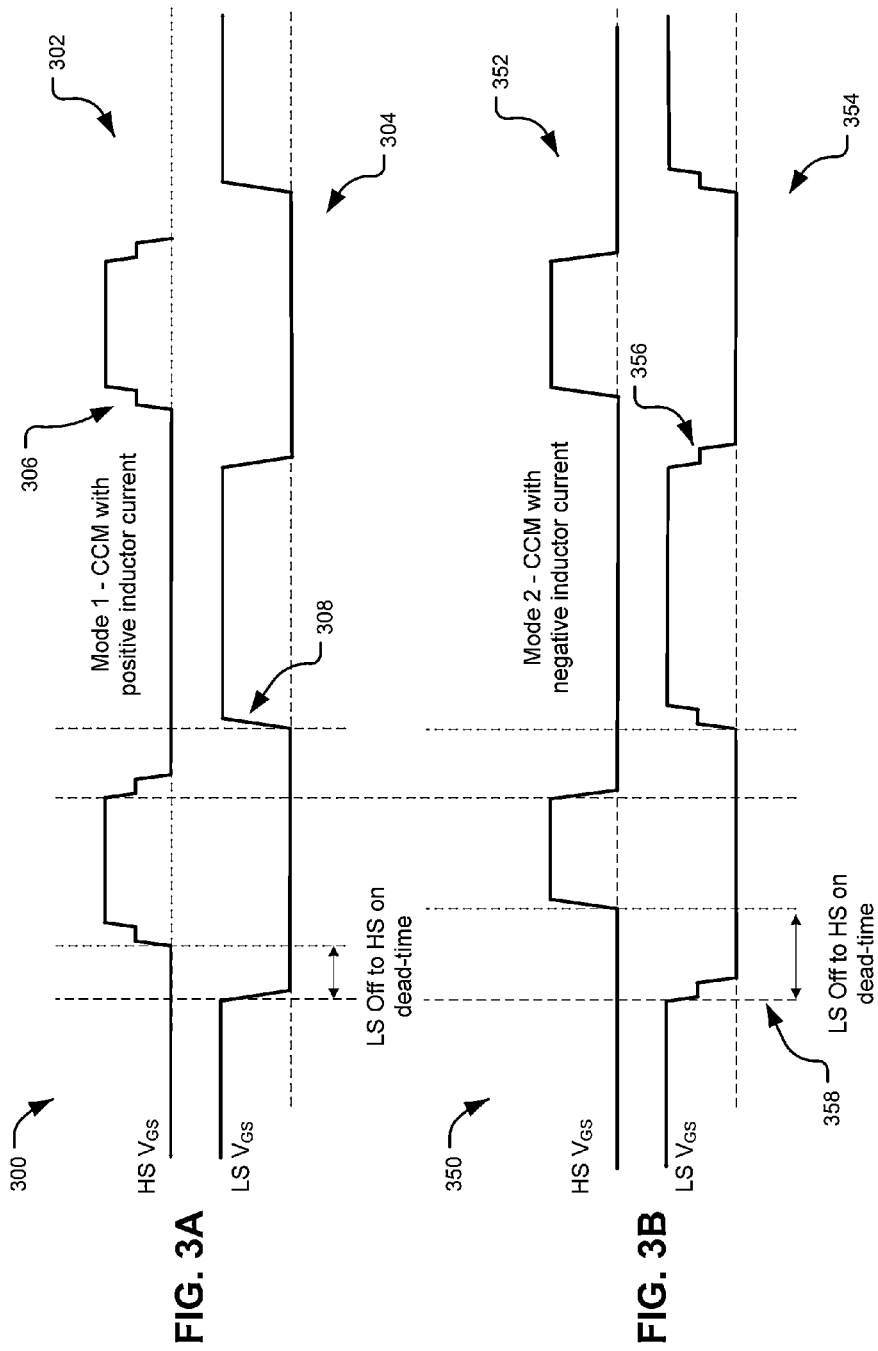

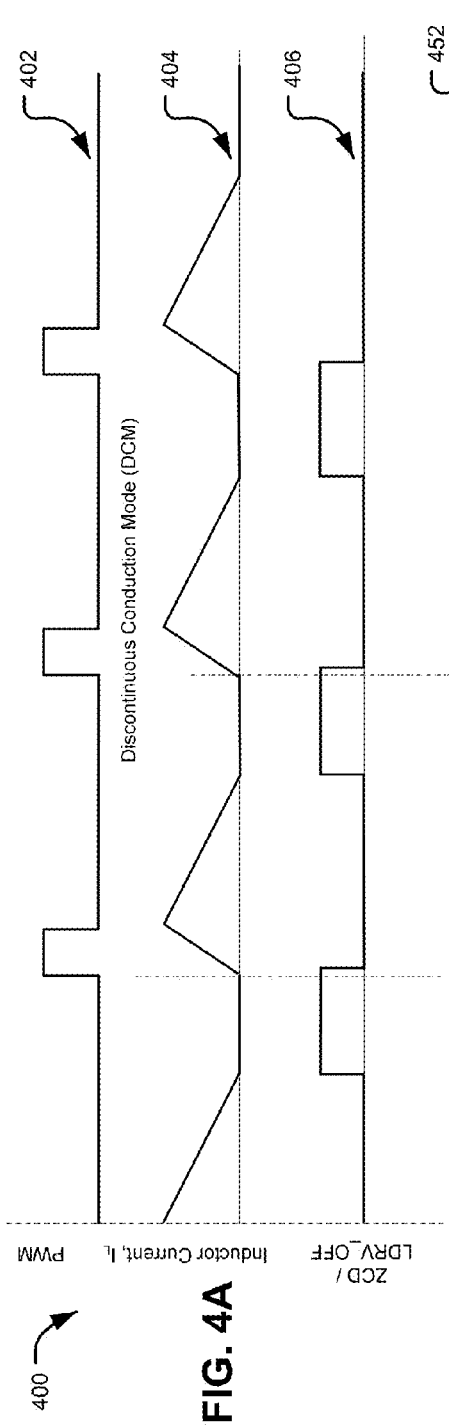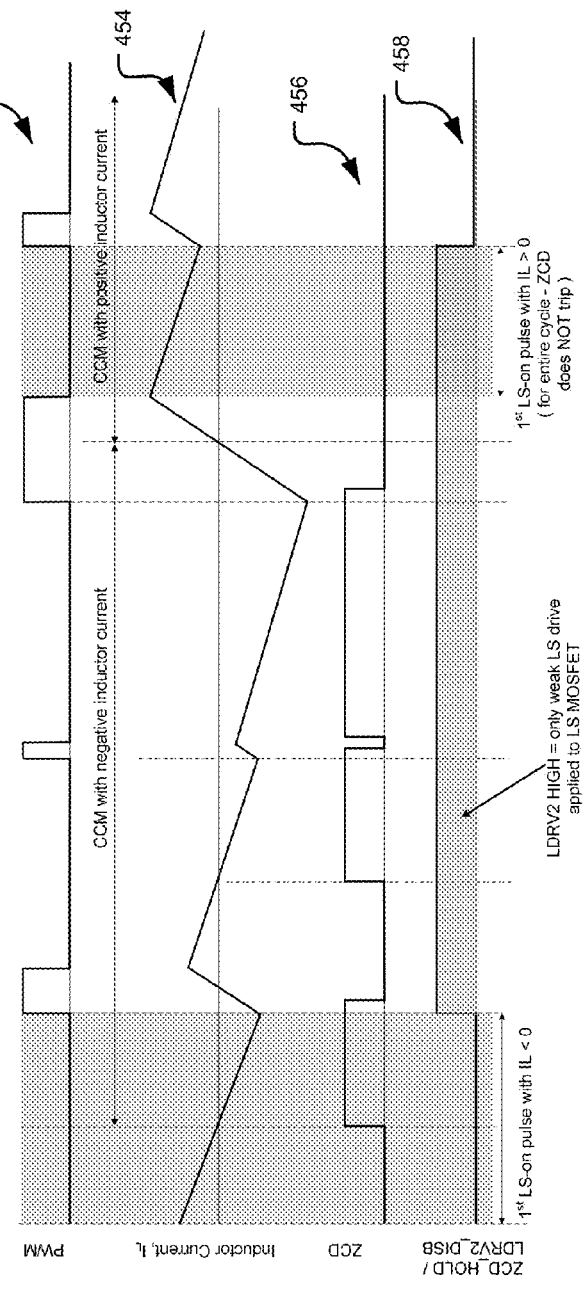
FIG. 4A
FIG. 4B

US 8,884,597 B2

SYNCHRONOUS BUCK CONVERTER WITH DYNAMICALLY ADJUSTABLE LOW SIDE GATE DRIVER

FIELD

The present disclosure relates to DC/DC converter topologies, and, more particularly, to synchronous buck converter topologies with dynamically adjustable low side gate driver.

BACKGROUND

Synchronous buck converters may be used in both continuous conduction mode (CCM) and discontinuous conduction mode (DCM), depending on the power demands of the load. In certain circumstances, load condition may change such that the load requires a reduction in current draw and/or increase/decrease of the output voltage, which can cause a synchronous buck converter to begin to sink current from the load and temporarily operate in "boost" mode. In such a state, current through an output inductor may be negative, which may cause a negative current flow (drain to source current) through a low side switch of the power supply. Such a negative current may cause unacceptable voltage spikes on the low side switch during switch transitions.

BRIEF DESCRIPTION OF DRAWINGS

Features and advantages of the claimed subject matter will be apparent from the following detailed description of embodiments consistent therewith, which description should be considered with reference to the accompanying drawings, wherein:

FIG. 3A illustrates signal graphs for power switches during a continuous conduction mode with positive inductor current of the power supply according to one embodiment of the present disclosure;

FIG. 3B illustrates signal graphs for power switches during a continuous conduction mode with negative inductor current of the power supply according to one embodiment of the present disclosure;

FIG. 4A illustrates timing graphs during a discontinuous conduction mode of the power supply according to one embodiment of the present disclosure;

FIG. 4B illustrates timing graphs during a continuous conduction mode and negative inductor current of the power supply according to one embodiment of the present disclosure;

Although the following Detailed Description will proceed with reference being made to illustrative embodiments, many alternatives, modifications, and variations thereof will be apparent to those skilled in the art.

DETAILED DESCRIPTION

Figure 1:
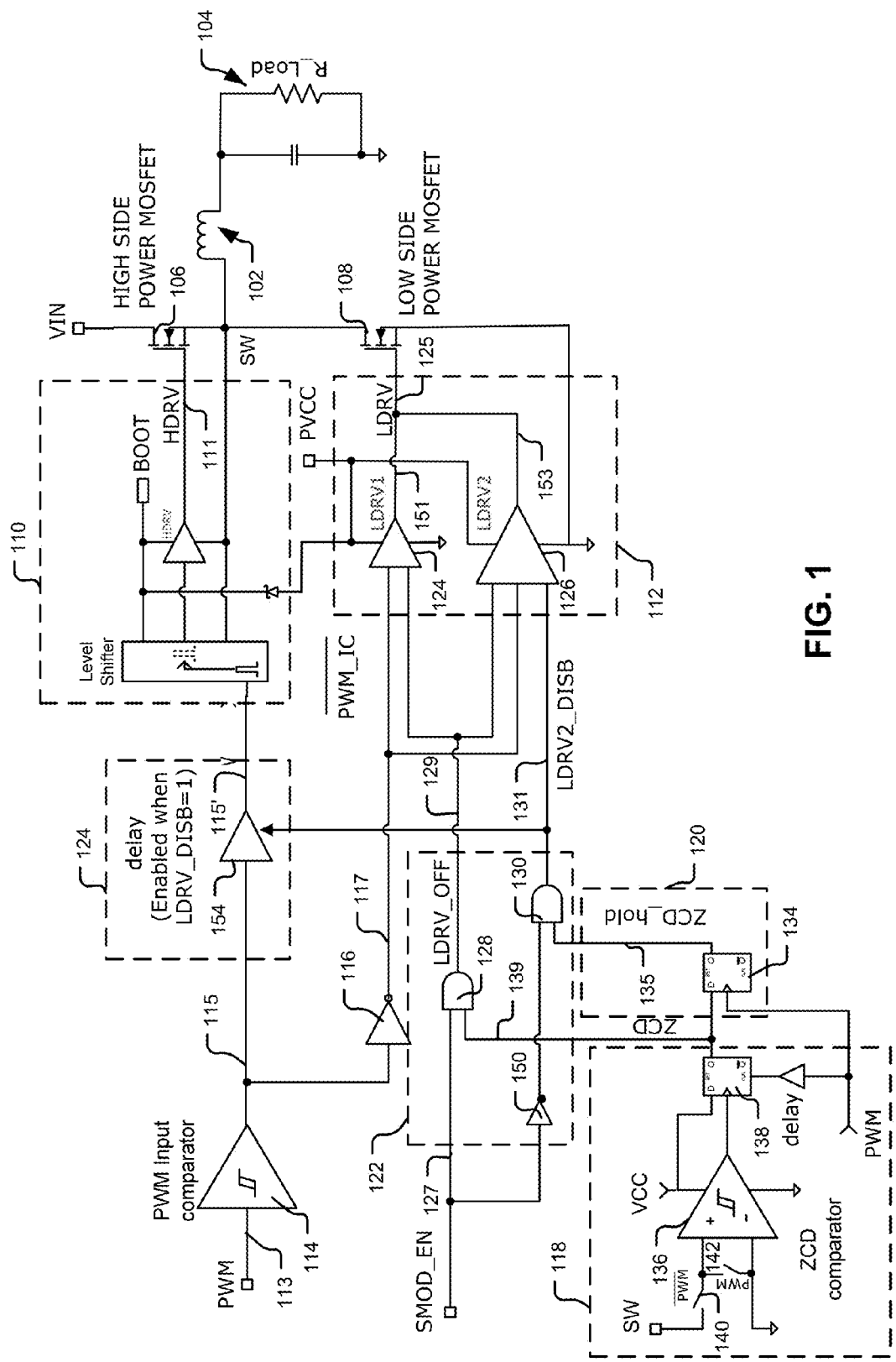
FIG. 1 illustrates a power supply system consistent with various embodiments of the present disclosure.

FIG. 1 illustrates a power supply system 100 consistent with various embodiments of the present disclosure. The power supply system 100 depicted in FIG. 1 may be included with, or form part of, a custom and/or general-purpose or custom integrated circuit (IC) such as a semiconductor integrated circuit chip, system on chip (SoC), multi-chip module (MCM), etc. The power supply system 100 described herein is a synchronous buck DC/DC converter configured to drive inductor circuitry 102 to supply power to a load 104. The system 100 of at least one embodiment includes a high side switch 106 (e.g., power MOSFET device, etc.) and a low side switch 108 (e.g., power MOSFET device, etc.) coupled to an input voltage Vin and configured to switch to drive the inductor circuitry 102. The switches 106/108 may include, for example, body diode circuitry (not shown) and/or other well known features of power supply switches. The system 100 also includes high side driver circuitry 110 configured to drive the high side power switch 106 and low side driver circuitry 112 configured to drive the low side power switch 108. As is well known, the switches 106 and 108 are controlled via a pulse width modulation (PWM) signal to drive the inductor circuitry 102 to controllably deliver power to the load circuitry 104. The system 100 also includes high side driver circuitry 110 configured to control the gate of the high side switch 106, low side driver circuitry 112 configured to control the gate of the low side switch 108 and PWM circuitry 114/116 configured to supply a controllable PWM signal 115 and a complementary PWM signal 117 to the high side driver circuitry 110 and low side driver circuitry 112, respectively. A PWM input signal 113 may be generated by, for example, a PWM controller (not shown) that may include well-known feedback control mechanisms to provide control over a duty cycle of the input PWM signal 113. In addition, in various embodiments described herein, the power supply 100 may also include zero crossing detector circuitry 118 configured to determine when the current, Il, through the inductor circuitry 102 crosses approximately zero amps, hold circuitry 120 configured to hold a state of a zero crossing event for a selected number of PWM cycles, logic circuitry 122 configured to control various states of the low side driver circuitry 112, and delay circuitry 124 configured to delay the operation of high side driver circuitry 110. These and other features of the various embodiments of FIG. 1 are described in greater detail below.

The load circuitry 104 may be configured to generate a load control signal 127 (SMOD_EN) indicative of the power demands of the load. For example, certain loads (e.g., microprocessors, complex loads, etc.) may require that the power supply system 100 source power to the load 104 and sink power from the load 104. As is known, a synchronous buck converter can operate to source power and to sink power (e.g., boost mode) when the load demands by requesting that the power supply allow Il to obtain negative values through the low side switch 108. During mode 1, the power supply 100 may source power to the load 104 and Il remains positive (e.g., CCM and DCM operations). During mode 2, the power supply may sink power from the load, and Il may therefore be permitted to go negative for some or all of the PWM cycle (e.g., "boost" mode). As used herein by convention, when load control signal 127 is enabled, or High, this indicates that the load 104 is demanding source current from the power supply 100 and when control signal is disabled, or Low, this indicates that the load 104 is demanding that the power supply 100 sink current from the load 104, through the low side switch 108. Of course, this only an example of the control states for the load control signal 127, and the power supply system 100 may be configured where the states of the load control signal 127 are the opposite of the states described above.

Zero crossing detector circuitry 118 may include hysteresis comparator circuitry 136 and latch circuitry 138. The latch circuitry 138 may include, for example, flip-flop circuitry (e.g., D-type flip-flop circuitry, as shown). The comparator circuitry 136 may include input switches 140 and 142, and the conduction states of the input switches 140 and 142 may be controlled by the PWM signals 117 and 115, respectively. The positive input of the comparator circuitry 136 may be coupled to the SW node between switch 106 and 108 to provide a signal indicative of Il. The output of the comparator circuitry 136 may be used to clock the latch circuitry 138, and the D input of the latch circuitry 138 may be coupled to a steady-state DC power supply (e.g., VCC). Since the input of comparator circuitry 136 is the SW node, the signal received from the SW node may be relatively noisy, and thus, latch circuitry 138 may avoid the "chatter" at the output of comparator circuitry 136. Circuitry 118 may also include latch delay circuitry 144 configured to delay a latch state of the latch circuitry 138, based on the PWM signal 115. The zero crossing detector circuitry 118 is configured to generate a zero crossing control signal 139 (ZCD) indicative of the state of Il. For example, if Il is positive, control signal 139 may be disabled (e.g., Low) and if Il is negative, control signal 139 may be enabled (e.g., High). Hold circuitry 120 is generally configured to hold the state of the zero crossing control signal 139 through one or more PWM cycles. The hold circuitry 120 may include latch circuitry 134 (e.g., D-type flip-flop circuitry, as shown) configured to latch the state of signal 139, and generate a latched zero crossing control signal 135 (ZCD_hold).

Figure 2:
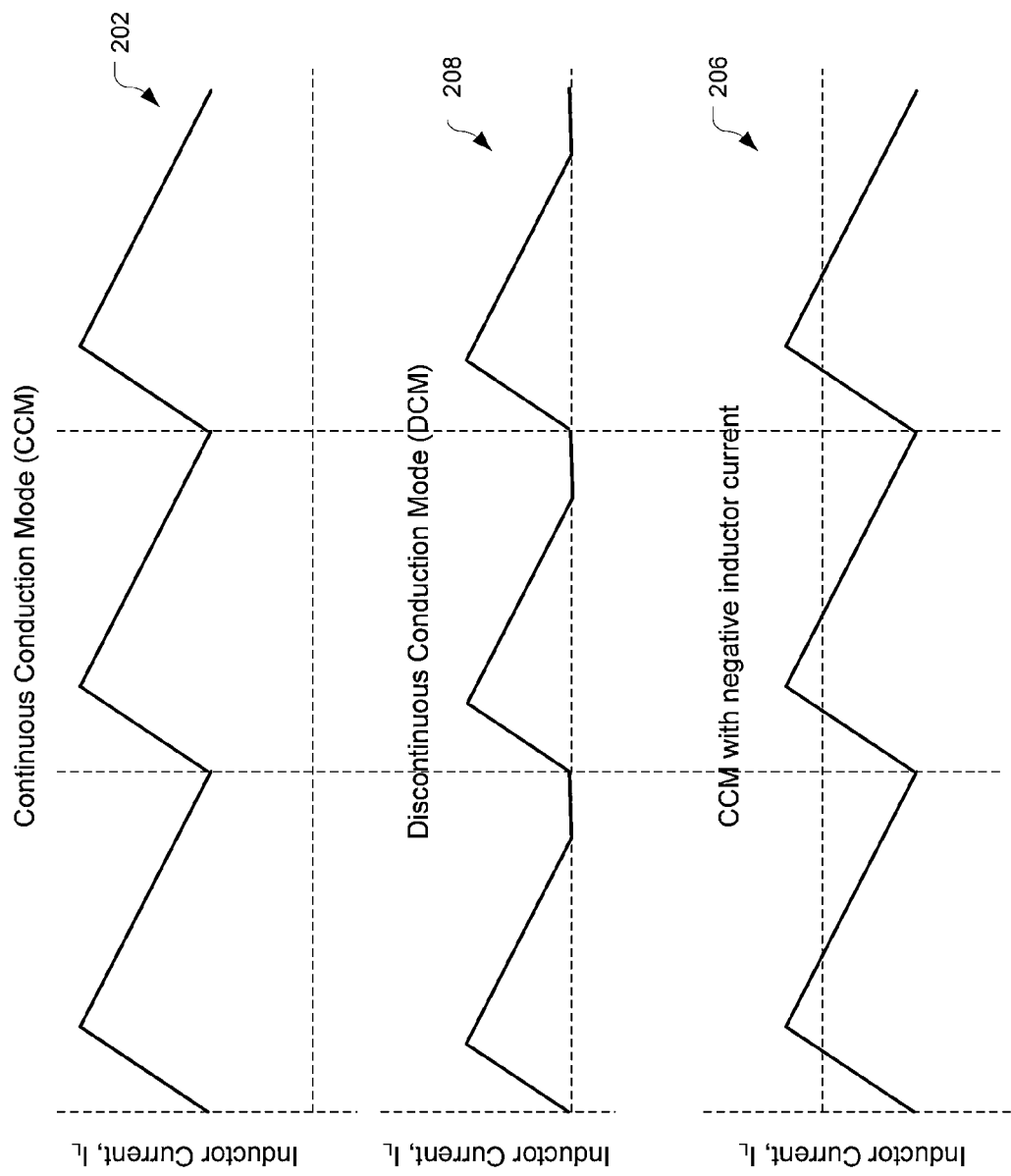
FIG. 2 illustrates inductor current signal graphs of various operating modes of the power supply according to one embodiment of the present disclosure.

As is known, a synchronous buck converter is generally operable in a continuous conduction mode (CCM) and a discontinuous conduction mode (DCM) to deliver power to a load 104. During CCM, the inductor current, Il, can remain positive (for example, when the power supply 100 is operating as a current source for the load 104) or Il can be permitted to go negative (for example, when the power supply 100 is operating as a current sink for the load 104). During DCM, Il is typically not permitted to go negative, and instead, Il is forced to be approximately zero during the time that Il would otherwise go negative. Referring briefly to FIG. 2, inductor current signal graphs during various operating modes are depicted. Signal graph 202 depicts the inductor current Il during CCM mode when the inductor current is always positive, signal graph 204 depicts the inductor current Il during DCM mode when the inductor current is at approximately zero when Il would otherwise be negative, and signal graph 206 depicts the inductor current Il during CCM mode when the inductor current is permitted to be negative. Throughout the following detailed description, the CCM and DCM modes when Il is always positive (or approximately zero) shall be referred to herein as "mode 1", and the CCM mode when Il is permitted to be negative shall be referred to herein as "mode 2". In mode 1, current through the inductor 102 is positive (or zero), and low side switch 108 operates in the "$3^{rd}$ quadrant", meaning that the current flows from source to drain through switch 108. In mode 2, when Il is negative, the low side switch 108 operates in the "$1^{st}$ quadrant", meaning that current flows from drain to source through switch 108. With conventional synchronous buck converter topologies, during mode 2, excessive transient voltage spike may occur on the switches 106 and 108 during switch state transitions, and such voltage spikes may exceed tolerance limits, for example, package pin tolerance limits.

Accordingly, the teachings of the present disclosure provide various mechanisms to reduce or minimize switching transient voltage spikes during mode 2. To enable control over the low side switch 108 and to reduce or eliminate spikes during switch state transitions (Low to High and High to Low), the low side driver circuitry 112 is configured to variably control the turn on/off speed of the low side switch 108, based on, at least in part, the operating mode of the system 100. In one embodiment, the low side driver circuitry 112 includes a plurality of driver circuits, e.g., a first driver circuit 126 (LDRV1) and a second driver circuit 128 (LDRV2). Driver circuits 124 and 126 may each be configured to generate a portion of a gate drive control signal 125 required to cause the low side switch 108 to transition states. Thus, the output 151 of the driver circuit 124 supplies a portion of the gate drive control signal 125 and the output 153 of the driver circuit 126 supplies another portion of the gate drive control signal 125. Driver circuits 124 and 126 are configured to receive the complimentary PWM signal 117. Driver circuit 124 may also be coupled to logic circuitry 122 (described below) and may be enabled when control signal 129 is logic Low and disabled when control signal 129 is logic High. Similarly, driver circuit 126 may also be coupled to logic circuitry 122 (described below) and may be enabled when control signal 129 is Low and control signal 131 is Low, and disabled when either control signal 129 and/or control signal 131 is High. Of course, this is only an example of the logic control for the driver circuits 124 and 126, and those skilled in the art will recognize that other logic control mechanisms may be utilized without departing from the teachings of the present disclosure.

During mode 1 (CCM), both driver circuits 124 and 126 may be enabled to generate the gate control signal 125 (represented as the sum of signal 151 and 153) to control the conduction state of the low side switch 108 (via control signal 125 (LDRV)). In this case, the gate control signal 125 (represented as the sum of signals 151 and 153) may be of sufficient strength to cause a "fast" (e.g., normal) switch transition of the low side switch 108 (High to Low and Low to High). For example, when the gate control signal 125 is represented as the sum of signals 151 and 153, the output resistance of the combined driver circuits 124 and 126 may be relatively low (e.g., 0.5 Ohms) so that the gate control signal 125 can drive the capacitive input of the low side switch 108 at a relatively fast rate (e.g. rise/fall times <10-15 nsec.). During mode 2, a portion of the low side driver circuitry 112 may be disabled so that the gate control signal 125 is weaker, i.e., more resistive and having reduced output current, than when the driver circuitry 112 is fully enabled in mode 1. Disabling a portion of the low side driver circuitry may operate to increase the pull-up and pull-down resistance of the low side switch 108 and thus causing a slowing a transition state of the low side switch 108 from Low to High and/or from High to Low when Il is negative. Thus, as used herein in this context, a "stronger" gate control signal 125 means that the gate control signal 125 able to drive the low side switch 108 at a faster rate (faster rise/fall time) than a "weaker" gate control signal 125. Reducing the strength of the gate control signal 125 slows the drain-source edges of the low side switch 108 during switch transitions. In one example embodiment, the first driver circuit 124 is configured to generate about 25% of the strength of the gate control signal 125 and the second driver circuit 126 is configured to generate about 75% of the strength of the gate control signal 125, and in such a configuration, when the second driver circuit 126 is disabled in mode 2, the rise and fall times of the switch transitions of the low side switch 108 is about 1.5-3 times slower than compared to when both driver circuits 124/126 are enabled in mode 1. Of course, one skilled in the art will recognize that these percentages are only examples, and this ratio of the strength of the first driver circuit 124 and the second driver circuit 126 may be changed based on, for example, a particular configuration, load requirement, switch characteristics, etc.

Logic circuitry 122 is configured to control the operation of the low side driver circuitry 112. The logic circuitry 122 may include a first AND gate 128 configured to AND the load control signal 127 (SMOD_EN) and zero crossing control signal 139 (ZCD) and generate a first driver control signal 129. The logic circuitry 122 may also include inverter circuitry 150 configured to invert the load control signal 127 (SMOD_EN). The logic circuitry 122 may also include a second AND gate 130 configured to AND an inverted load control signal 127 and the latched zero crossing control signal 135 and generate a second driver control signal 129. The first driver control signal 129 may be coupled to the first and second driver circuits 124 and 126, and the second driver control signal 131 may be coupled to the second driver circuit 126.

High side driver circuitry 110 is configured to control the conduction state of the high side switch 106, and may generally include well-known circuits/components configured to generate a high side gate control signal 111 to control the conduction state of the high side switch 106, based on the PWM signal 115. For example, the high side driver circuitry 110 may be coupled to the PWM signal and include level shifter circuitry and a driver circuit (shown but not referenced with reference numerals) configured in a well known manner to control the high side switch 106. To prevent cross conduction between the low side switch 108 and the high side switch 106 during mode 2 (described more fully below), at least one embodiment of the present disclosure may also include delay circuitry 124 configured to delay a transition state of the high side switch 106 when the transition state of the low side switch 106 is delayed. In one embodiment, the delay circuitry 124 may include a delay buffer circuit 154 coupled to the PWM signal 115 and configured to generate a delayed PWM signal 115'. The amount of the delay between signal 115 and 115' may be based on, for example, the total switch transition time of the low side switch 108 when the switch transition time of the low side switch is slowed as a result of a weaker gate control signal 125 caused by disabling a portion of the low side driver circuitry 112 during mode 2 when Il is negative. The delay buffer circuit 154 may be enabled by the second driver control signal 131, for example when the second driver control signal 131 is High, so that when the low side driver circuitry is partially disabled during mode 2, the delay buffer circuit 154 is enabled. The delayed PWM signal 115' may cause the high side driver circuitry 110 to impart a proportional delay the gate control signal 111.

The operation of the power supply system 100 with reference to the various modes is described in greater detail below.

Mode 1, CCM, Il>0

In operation, during mode 1 CCM, the system 100 operates in a condition where Il is positive and the low side switch 108 operates in the $3^{rd}$ quadrant. Load control signal 127 (SMOD_EN) from the load 104 is held High, indicating that the load 104 is requiring that the power supply source power to the load 104. If Il remains positive, the zero crossing control signal 139 and the latched zero crossing control signal 135 will remain Low, and thus the first driver control signal 129 and the second driver control signal will remain Low. Thus, both driver circuits 124 and 126 are enabled, and the gate drive control signal 125 is sufficient to control the low side switch 108 for fast switch transitions. The PWM signal 115 controls the high side driver circuitry 110 to control the conduction state of the high side switch 106, the complimentary PWM signal 117 controls the low side driver circuitry 112 to control the conduction state of the high side switch 108, as is well known during mode 1 CCM. Briefly, FIG. 3A illustrates signal graphs 300 for power switches during a continuous conduction mode with positive inductor current of the power supply according to one embodiment of the present disclosure. Signal graph 302 represents the gate control signal ($V_{GS}$) for the high side switch 106 and signal graph 304 represents the gate control signal ($V_{GS}$) for the low side switch 108. The delay 306 in the gate control signal 302 is a well known feature of high side switch characteristics (e.g., the Miller plateau). Since the drive control signal 125 (FIG. 1) is sufficient to control the low side switch 108 for fast switch transitions, the low side gate control signal 304 switches relatively quickly, as noted at 308.

Mode 1, DCM, Il>0

In operation, during mode 1 DCM, the system 100 operates in a condition where Il is positive and/or approximately zero and the low side switch 108 operates in the 3rd quadrant. Load control signal 127 (SMOD_EN) from the load 104 is held High, indicating that the load 104 is requiring that the power supply source power to the load 104. The DCM mode may be utilized, for example, when the load 104 requires less power than can be supplied in the CCM mode. If Il remains positive, the zero crossing control signal 139 and the latched zero crossing control signal 135 will remain Low, and thus the first driver control signal 129 and the second driver control signal will remain Low. Thus, both driver circuits 124 and 126 are enabled, and the total drive control signal 125 is sufficient to control the low side switch 108 for fast switch transitions. When Il attempts to go negative, the zero crossing control signal 139 will change from Low to High, and on the next High PWM cycle, the latched zero crossing control signal 135 will change from Low to High. The first driver control signal 129 changes from Low to High, thus disabling the low side driver circuitry 112 (e.g., disabling the first driver circuit 124 and the second driver circuit 126). This will cause the low side switch 108 to turn off (non-conductive), and the inductor current Il will "clip" at approximately zero, i.e., without going negative. The PWM signal 115 controls the high side driver circuitry 110 to control the conduction state of the high side switch 106, the complimentary PWM signal 117 controls the low side driver circuitry 112 to control the conduction state of the high side switch 108, as is well known during mode 1 DCM. FIG. 4A illustrates timing graphs 400 during a DCM of the power supply 100 according to one embodiment of the present disclosure. Timing graph 402 illustrates the PWM signal 115, timing graph 404 illustrates the inductor current Il, and timing graph 406 illustrates the zero crossing control signal 139 and the first driver control signal 129. As is illustrated in FIG. 4A and with continued reference to FIG. 1, when Il 404 begins to cross from positive to negative (zero crossing and PWM signal 115 Low, complimentary PWM signal 117 High), the zero crossing control signal 139 and the first driver control signal 129 transition from Low to High, thus disabling the low side driver control circuitry 112 to turn the low side switch 108 off. The zero crossing control signal 139 and the first driver control signal 129 remain High until the PWM signal 402 transitions from Low to High, thus causing Il 404 to transition from approximately zero to positive inductor current.

Mode 1, CCM, Il>0 and/or Il<0

In operation, during mode 2 CCM, the system 100 operates in a condition where Il may be positive and/or negative. When Il is positive, the low side switch 108 operates in the 3rd quadrant and when Il is negative, the low side switch 108 operates in the 1st quadrant. To enable negative current through the inductor 102 the load 104 may transition the load control signal 127 (SMOD_EN) High to Low, indicating that the load 104 is requiring that the power supply sink power from the load 104 during at least part of a PWM cycle. If Il remains positive, the zero crossing control signal 139 and the latched zero crossing control signal 135 will remain Low, and thus the first driver control signal 129 and the second driver control signal will remain Low. Thus, both driver circuits 124 and 126 are enabled, and the total drive control signal 125 is sufficient to control the low side switch 108 for fast switch transitions (e.g., to quickly charge/discharge $V_{GS}$ of the low side switch 108). If Il begins to go negative, the zero crossing control signal 139 will transition from Low to High, and on the next High PWM signal, the latched zero crossing control signal 135 will transition from Low to High, and remain latched High while Il is negative and for a complete PWM cycle after Il becomes positive. As described above, when the zero crossing control signal 139 and the latched zero crossing control signal 135 are High, the second gate driver circuit 126 is disabled (via control signals 129 and 131), and thus, the low side switch is controlled by the first gate driver circuit 124. Since a portion of the low side driver circuitry 112 is disabled, the gate control signal 125 is insufficient to cause a fast switch transition for the low side switch 108, thus slowing the switch transition of the low side switch 108 to reduce or minimize the overshoot and ringing effects caused by fast switch transition of the low side switch 108 when Il is negative (low side switch operating in the 1st quadrant). Also, when the second control signal 131 transitions from Low to High (when signal 135 transitions from Low to High), the delay circuitry 124 is enabled, thus causing a delay in the PWM signal 115 and a delay in the high side gate control signal 111. The delay imparted by the delay circuit 124 may be approximately the same as, or proportional to, the total switch transition time of the low side switch 108 when the switch transition time of the low side switch is slowed as a result of a weaker gate control signal 125 caused by disabling a portion of the low side driver circuitry 112 during mode 2 when Il is negative.

FIG. 3B illustrates signal graphs 350 for power switches during a continuous conduction mode with negative inductor current of the power supply according to one embodiment of the present disclosure. Signal graph 352 represents the gate control voltage ($V_{GS}$) for the high side switch 106 and signal graph 354 represents the gate control signal ($V_{GS}$) for the low side switch 108. The plateau 356 in the gate control signal 354 is created by slowing the switching of the low side switch 108, as described above. In addition, a delay 358 in the gate control signal 352 is created by delaying the switching of the high side switch 106, as described above, when Il is negative. Also, when Il is negative, the low side switch 108 essentially becomes the "control" switch, and thus, the high side switch 106 generally changes states using relatively fast switch transitions, as shown.

FIG. 4B illustrates timing graphs 450 during a CCM of the power supply 100 according to one embodiment of the present disclosure. In the example of FIG. 4B, Il is both positive and negative. Timing graph 452 illustrates the PWM signal 115, timing graph 454 illustrates the inductor current Il, timing graph 456 illustrates the zero crossing control signal 139, and timing graph 458 illustrates the latched zero crossing control signal 135 and the first driver control signal 129. As is illustrated in FIG. 4B and with continued reference to FIG. 1, when Il 454 begins to cross from positive to negative (zero crossing and PWM signal 115 Low, complimentary PWM signal 117 High), the zero crossing control signal 139 transitions from Low to High while Il remains negative and PWM remains Low. On the next PWM High transition, the latched zero crossing control signal 135 (and the first driver control signal 129) transition from Low to High, and remain High until Il is positive for a complete PWM cycle. When the first driver control signal 129 is High, the second drive circuit 126 is disabled, thus slowing the switch transition of the low side switch 108, as described herein.

Comparative Simulations

Figure 5:
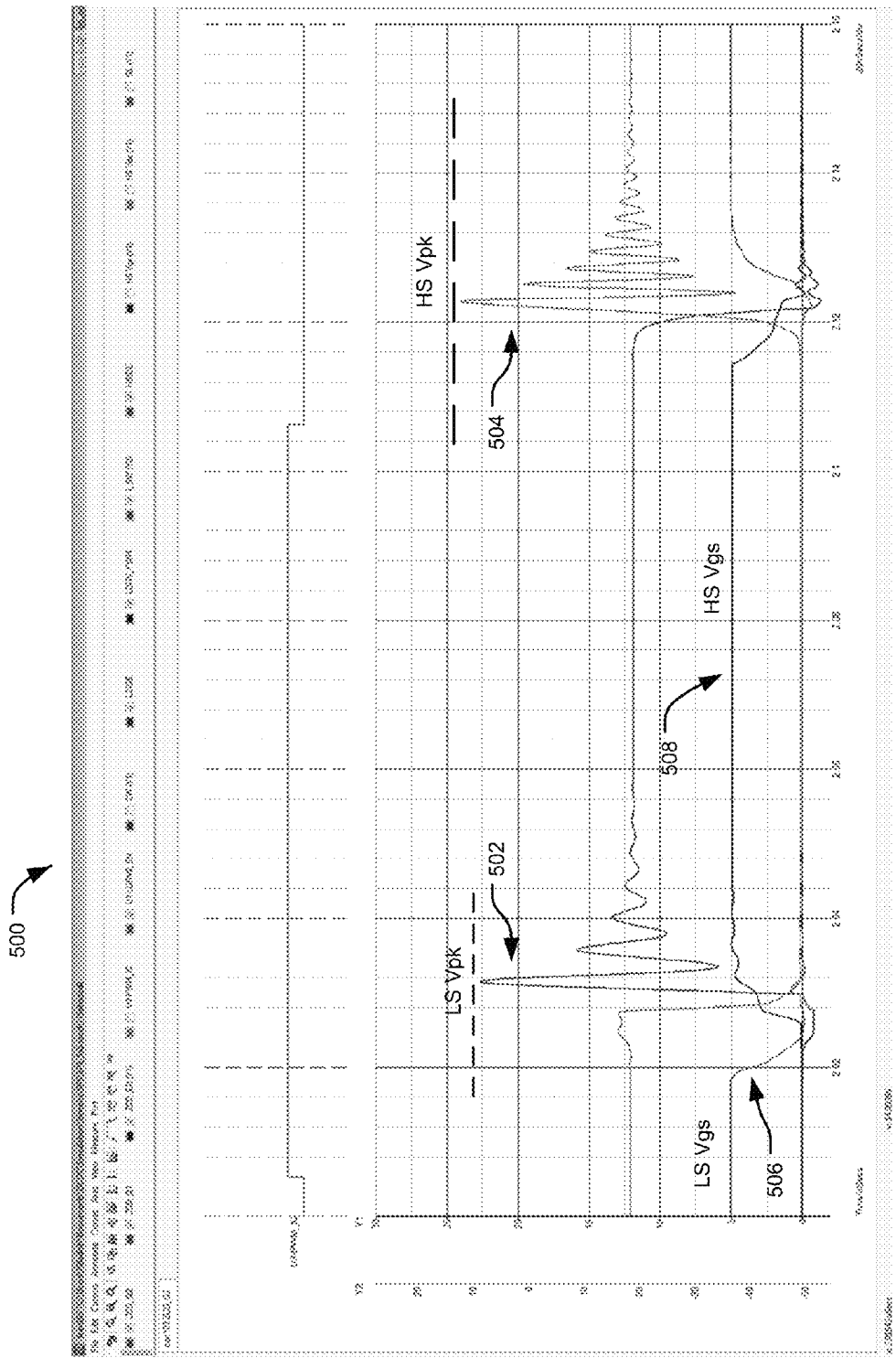
FIG. 5 illustrates simulation signal graphs of a conventional synchronous buck converter during a continuous conduction mode.
Figure 6:
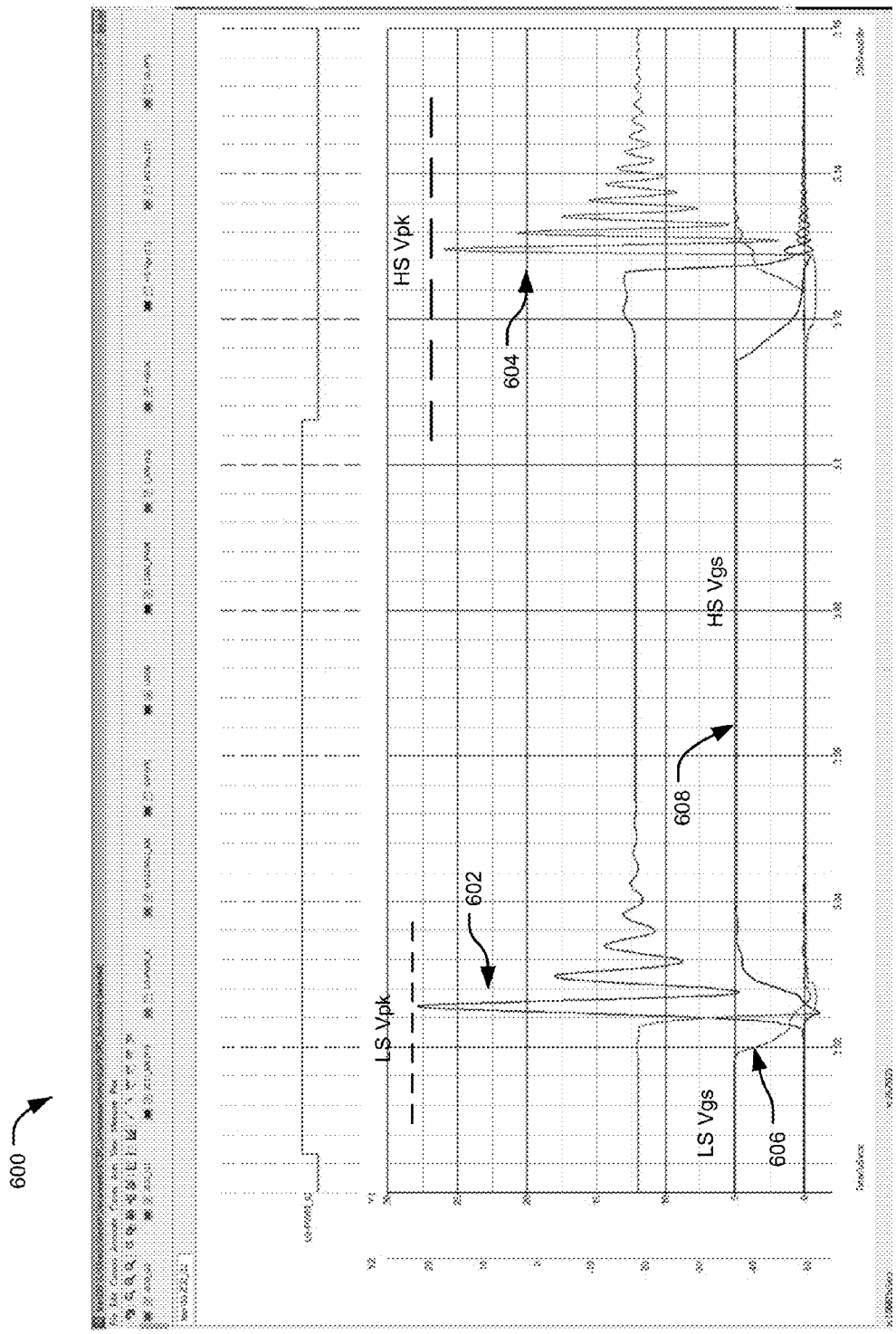
FIG. 6 illustrates simulation signal graphs of a conventional synchronous buck converter during a continuous conduction mode with negative inductor current.
Figure 7:
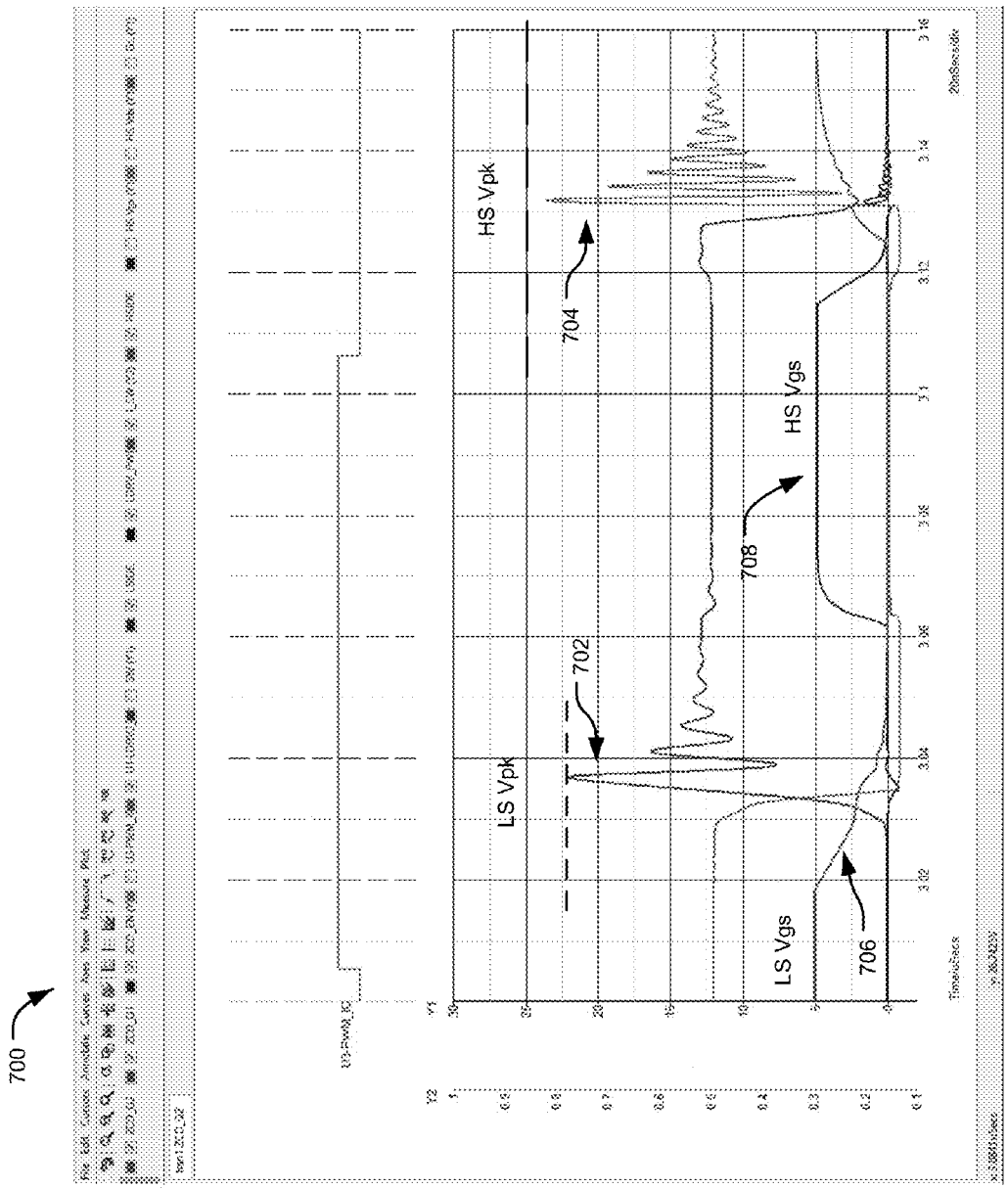
FIG. 7 illustrates simulation signal graphs of a synchronous buck converter according to one embodiment of the present disclosure during a continuous conduction mode with negative inductor current.

FIGS. 5 and 6 illustrate simulation signal graphs 500, 600 of a conventional synchronous buck converter with convention driver circuitry during a continuous conduction mode and during a continuous conduction mode with negative inductor current, respectively. FIG. 7 illustrates simulation signal graphs 700 of a synchronous buck converter according to one embodiment of the present disclosure during a continuous conduction mode with negative inductor current. The simulation signal graphs of FIG. 7 represent a circuit simulation for a power supply similar to the power supply 100 of FIG. 1. The simulations of FIGS. 5, 6 and 7 assume that the low side switch and the high side switch are rated at 25 Volts. In the conventional circuit simulation of FIG. 5, signal 502 represents the voltage ($V_{DS}$) on the low side switch, signal 504 represents the voltage ($V_{DS}$) on the high side switch, signal 506 represents the low side gate control voltage ($V_{GS}$) and signal 508 represents the high side gate control voltage ($V_{GS}$). As is noted in FIG. 5, the low side gate control signal 506 and the high side gate control signal 508 are configured to cause their respective switches to switch conduction states at a relatively fast rate. Thus, during switch transitions both the low side switch and the high side switch have large transient $V_{DS}$ voltages, and in this simulation of a conventional synchronous buck converter during CCM, the peak transient $V_{DS}$ voltage (Vpk) on the low side switch is approximately 23 Volts and the peak transient $V_{DS}$ voltage (Vpk) on the high side switch is approximately 24 Volts. This is generally within the voltage tolerance of the low and high side switches (25 Volts), and generally represents common operational conditions of a conventional synchronous buck converter during CCM.

In the conventional circuit simulation of FIG. 6, signal 602 represents the voltage ($V_{DS}$) on the low side switch, signal 604 represents the voltage ($V_{DS}$) on the high side switch, signal 606 represents the low side gate control voltage ($V_{GS}$) and signal 608 represents the high side gate control voltage ($V_{GS}$). As is noted in FIG. 6, the low side gate control signal 606 and the high side gate control signal 608 cause their respective switches to switch conduction states at a relatively fast rate. Thus, during switch transitions both the low side switch and the high side switch have large transient $V_{DS}$ voltages, and in this simulation of a conventional synchronous buck converter during CCM with negative inductor current, the peak transient $V_{DS}$ voltage (Vpk) on the low side switch is approximately 28 Volts and the peak transient $V_{DS}$ voltage (Vpk) on the high side switch is approximately 26 Volts. This is greater than the voltage tolerance of the low and high side switches (25 Volts), and generally represents common operational conditions of a conventional synchronous buck converter during CCM with negative inductor current. By exceeding the voltage tolerance limits of the low and high side switches, the conventional synchronous buck converter can exceed IC package tolerances which can disadvantageously impact the operation of the power supply itself, as well as other circuits/systems of the IC and/or associated circuitry. In addition, exceeding the voltage tolerance limits of the low and high side switches can create voltage stresses on the switches, power drain/loss issues, thermal management issues, and/or limitations on the life and accuracy of the power supply.

In contrast to the conventional synchronous buck converter, slowing the transition of the low side switch when the inductor current is negative advantageously reduces transient $V_{DS}$ voltages on the low side and high side switches to within tolerance limits. In the circuit simulation of FIG. 7, signal 702 represents the voltage ($V_{DS}$) on the low side switch, signal 704 represents the voltage ($V_{DS}$) on the high side switch, signal 706 represents the low side gate control voltage ($V_{GS}$) and signal 708 represents the high side gate control voltage ($V_{GS}$). As is noted in FIG. 7, the low side gate control signal 706 during a state transition (High to Low and/or Low to High) is slower than a state transition of the low side gate control signal 506/606 of the conventional synchronous buck converter of FIGS. 5 and 6. The high side gate control signal 708 has a delayed state transition, based on the speed of the state transition of the low side gate control signal (as described above, the delay in signal 708 is to avoid cross conduction of the low side and high side switches). Thus, during switch transitions both the low side switch and the high side switch the peak transient $V_{DS}$ voltage (Vpk) on the low side switch is approximately 22 Volts and the peak transient $V_{DS}$ voltage (Vpk) on the high side switch is approximately 24 Volts. This is generally within the voltage tolerance of the low and high side switches (25 Volts), and thus, the present disclosure advantageously resolves the problems associated with a conventional synchronous buck converter.

Figure 8:
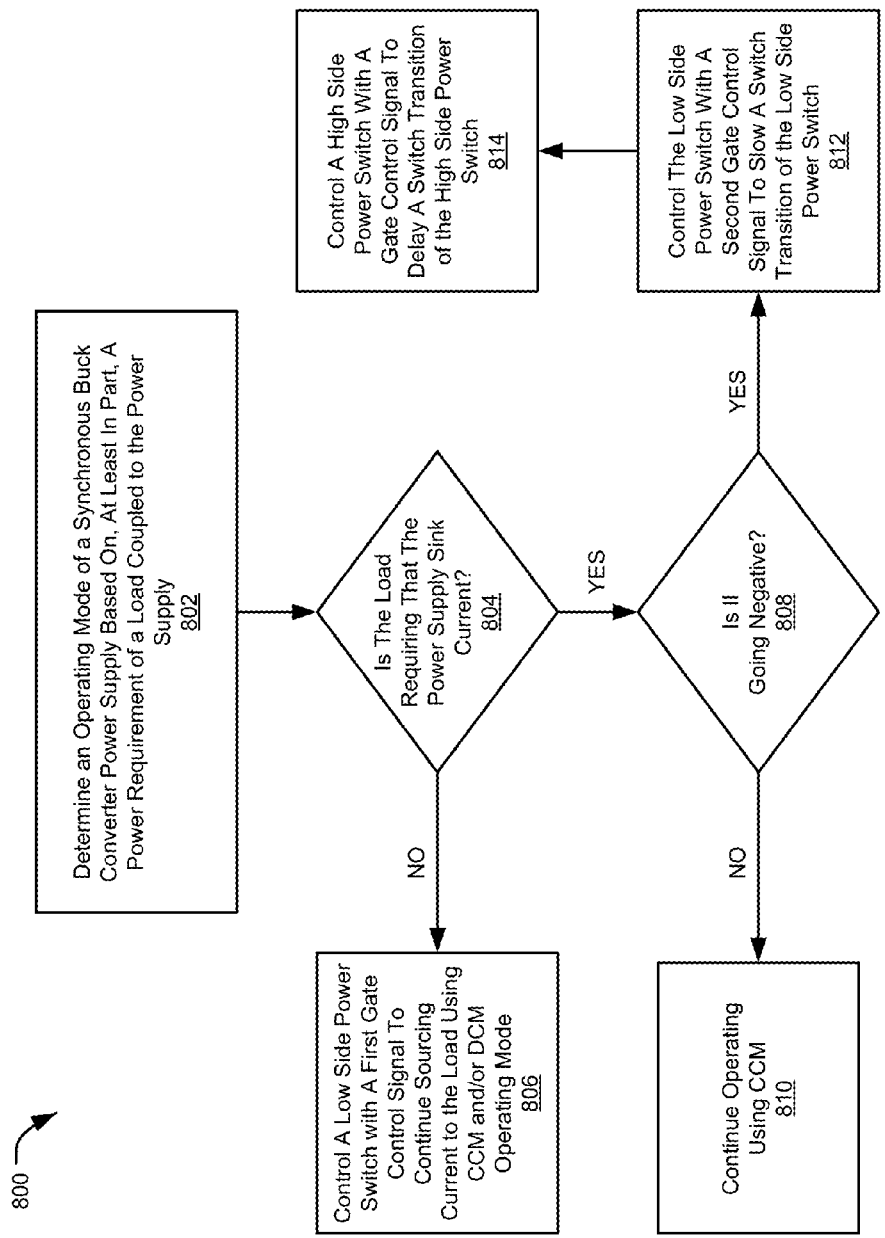
FIG. 8 illustrates a flowchart of operations consistent with one embodiment of the present disclosure.

FIG. 8 illustrates a flowchart 800 of operations consistent with one embodiment of the present disclosure. Operations of this embodiment may include determining an operating mode of a synchronous buck converter power supply based on, at least in part, a power requirement of a load coupled to the power supply 802. The operating modes may include, for example, CCM or DCM, and the load may require that the power supply both sources current (such that current through an output inductor is positive or zero) or sinks current (such that current through an output inductor may be negative). Operations of this embodiment also include determining if the load is requiring that the power supply sink current 804. If not, operations of this embodiment include controlling a low side power switch with a first gate control signal to source current to the load using a CCM and/or DCM operating mode 806. If the load requires that the power supply sink current (804), operations of this embodiment may also include determining if the inductor current, Il, is going negative 808. If not, operations of this embodiment include continuing operations of the power supply using a CCM mode 810. If Il is going negative (808), operations of this embodiment include controlling the low side power switch with a second gate control signal to slow a switch transition of the low side switch 812, relative to a transition state when the low side power switch is controlled with the first gate control signal. The second gate control signal is weaker than the first gate control signal, meaning that the second gate control signal has higher resistance, lower drive current and slower edge rates compared to the first gate control signal. Slowing the switch transition of the low side switch when Il is negative may enable greater control over voltage transient spikes that might otherwise be observed on the low and high side switches of the power supply. Operations of this embodiment may also include controlling a high side switch with a gate control signal to delay a switch transition of the high side switch. Here, the delay may be proportional to the total switch transition time of the low side switch when the switch transition time of the low side switch is slowed as a result of a second gate control signal when Il is negative.

While FIG. 8 illustrates various operations according to one embodiment, it is to be understood that in not all of these operations are necessary. Indeed, it is fully contemplated herein that in other embodiments of the present disclosure, the operations depicted in FIG. 8 may be combined in a manner not specifically shown in any of the drawings, but still fully consistent with the present disclosure. Thus, claims directed to features and/or operations that are not exactly shown in one drawing are deemed within the scope and content of the present disclosure. In addition, "circuitry" or "circuit", as used in any embodiment herein, may comprise, for example, singly or in any combination, hardwired circuitry, programmable circuitry, state machine circuitry, and/or circuitry available in a larger system, for example, discrete elements that may be included as part of an integrated circuit. In addition, any of the switch devices described herein may include any type of known or after-developed switch circuitry such as, for example, MOS transistor, BJT, SiC, etc.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A synchronous buck DC-DC converter system, comprising:
   a high side switch and a low side switch coupled to a power supply, each switch is configured to transition states from an on state to an off state and from an off state to an on state to deliver current to an inductor and a load;
   low side driver circuitry configured to control the conduction state of the low side switch and configured to drive the low side switch with a first gate drive control signal during a first mode of operation and with a second gate drive control signal during a second mode of operation;
   wherein the first gate drive control signal is stronger than the second gate drive control signal and the second gate drive control signal is configured to cause a slower switch transition of the low side switch compared to the first gate drive control signal; and
   wherein the first mode of operation includes at least one of a continuous conduction mode (CCM) or a discontinuous conduction mode (DCM) when current through the inductor is positive relative to the load, and the second mode of operation includes the CCM when current through the inductor is negative relative to the load.

2. The system of claim 1, further comprising logic circuitry configured to control the operation of the low side driver circuitry; and wherein the load is configured to generate a load control signal indicative of a requirement to operate in the first mode of operation or the second mode of operation; and
   wherein the logic circuitry is further configured to control the low side driver circuitry to generate the first gate drive control signal and the second gate drive control signal based on, at least in part, the load control signal.

3. The system of claim 2, further comprising zero crossing detector circuitry configured to determine if the current in the inductor is negative relative to the load and generate a zero crossing control signal indicative of if the current in the inductor is negative relative to the load; and
wherein the logic circuitry is further configured to control the low side driver circuitry to generate the first gate drive control signal and the second gate drive control signal based on, at least in part, the zero crossing control signal.

4. The system of claim 3, further comprising hold circuitry configured to latch the state of the zero crossing control signal and generate a latched zero crossing control signal having a state based on, at least in part, the current in the inductor.

5. The system of claim 4, wherein the logic circuitry comprises first AND gate circuitry configured to receive the load control signal and the zero crossing control signal and generate a first control signal to control the low side driver circuitry to generate the first gate drive control signal; and
second AND circuitry configured to receive an inverted load control signal and the latched zero crossing control signal and generate a second control signal to control the low side driver circuitry to generate the second gate drive control signal.

6. The system of claim 1, wherein the low side driver circuitry comprises a first driver circuit and a second driver;
wherein during the first mode of operation, the first and second driver circuits are enabled to generate the first gate drive control signal; and
wherein during the second mode of operation the second driver circuit is disabled and the first driver circuit is enabled to generate the second gate drive control signal.

7. The system of claim 1, further comprising high side driver circuitry configured to control the conduction state of the high side switch; and
delay circuitry configured to delay the high side driver circuitry to cause a delay in a transition of the high side switch during the second mode of operation.

8. The system of claim 7, further comprising delay circuitry configured to delay an operation of the high side driver circuitry.

9. The system of claim 1, wherein the high side switch and the low side switch are configured to transition states based on, at least in part, a pulse width modulation (PWM) signal and a complimentary PWM signal, respectively.

10. A synchronous buck DC-DC converter system, comprising:
a high side switch and a low side switch coupled to a power supply, each switch is configured to transition from an on state to an off state and from an off state to an on state to deliver current to an inductor and a load coupled to the high side switch and the low side switch;
low side driver circuitry configured to generate a switch drive control signal to variably control at least one of the turn on speed or turn off speed of the low side switch based on, at least in part, a power requirement of the load; and
wherein a first mode of operation includes at least one of a continuous conduction mode (CCM) or a discontinuous conduction mode (DCM) when current through the inductor is positive relative to the load, and a second mode of operation including the CCM when current through the inductor is negative relative to the load.

11. The system of claim 10, wherein switch drive control signal includes a first switch drive control signal and a second switch drive control signal; and
wherein the first switch drive control signal is stronger than the second switch drive control signal and the second switch drive control signal is configured to cause a slower switch transition of the low side switch compared to the first switch drive control signal.

12. The system of claim 10, further comprising logic circuitry configured to control the operation of the low side driver circuitry;
wherein the load is configured to generate a load control signal indicative of a requirement to operate in a first mode of operation or a second mode of operation; and
wherein the logic circuitry is further configured to control the low side driver circuitry based on, at least in part, the load control signal.

13. The system of claim 12, further comprising zero crossing detector circuitry configured to determine if the current in the inductor is negative relative to the load and generate a zero crossing control signal indicative of if the current in the inductor is negative relative to the load; and
wherein the logic circuitry is further configured to control the low side driver circuitry based on, at least in part, the zero crossing control signal.

14. The system of claim 10, wherein the low side driver circuitry comprises a first driver circuit and a second driver;
wherein during a first mode of operation, the first and second driver circuits are enabled to generate a first switch drive control signal having a first signal strength;
wherein during a second mode of operation the second driver circuit is disabled and the first driver circuit is enabled to generate a second switch drive control signal having a second signal strength; and
wherein the first signal strength is greater than the second signal strength.

15. The system of claim 10, further comprising high side driver circuitry configured to control the conduction state of the high side switch; and
delay circuitry configured to delay the high side driver circuitry to cause a delay in a transition of the high side switch during at least one mode of operation.

16. A method of controlling a synchronous buck DC-DC converter power supply, comprising:
determining an operating mode of the power supply based on, at least in part, a power requirement of a load coupled to the power supply;
determining if an inductor current of an inductor coupled to the power supply is positive or negative relative to the load;
controlling a low side switch of the power supply with a first switch control signal if the inductor current is positive;
controlling the low side switch of the power supply with a second switch control signal if the inductor current is negative;
wherein the first switch control signal is stronger than the second switch control signal and the second switch control signal is configured to cause a slower switch transition of the low side switch compared to the first switch control signal; and
wherein the operating mode includes a first mode of operation that includes at least one of a continuous conduction mode (CCM) or a discontinuous conduction mode (DCM) when current through the inductor is positive relative to the load, and a second mode of operation that includes the CCM when current through the inductor is negative relative to the load.

17. The method of claim 16, further comprising:
controlling a high side switch of the power supply to delay a switch transition of a high side switch if the inductor current is negative.

* * * * *